United States Patent
Wu et al.

(10) Patent No.: US 9,048,087 B2
(45) Date of Patent: Jun. 2, 2015

(54) METHODS FOR WET CLEAN OF OXIDE LAYERS OVER EPITAXIAL LAYERS

(71) Applicant: Taiwan Semiconductor Manufacturing Company, Ltd., Hsin-Chu (TW)

(72) Inventors: Li-Lan Wu, Hsin-Chu (TW); Chi-Yuan Chen, Hsin-Chu (TW); Ming-Chyi Liu, Hsin-Chu (TW); Cary Chia-Chiung Lo, Taipei (TW); Teng-Chun Tsai, Hsin-Chu (TW); Cheng-Tung Lin, Jhudong Township (TW); Kuo-Yin Lin, Jhubei (TW); Li-Ting Wang, Tainan (TW); Wan-Chun Pan, Hsin-Chu (TW); Ming-Liang Yen, New Taipei (TW); Huicheng Chang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 167 days.

(21) Appl. No.: 13/924,193

(22) Filed: Jun. 21, 2013

(65) Prior Publication Data

US 2014/0273412 A1 Sep. 18, 2014

Related U.S. Application Data

(60) Provisional application No. 61/784,768, filed on Mar. 14, 2013.

(51) Int. Cl.
*H01L 21/336* (2006.01)
*H01L 21/02* (2006.01)
*H01L 29/66* (2006.01)

(Continued)

(52) U.S. Cl.
CPC ...... *H01L 21/0206* (2013.01); *H01L 29/66795* (2013.01); *H01L 29/66439* (2013.01); *H01L 29/775* (2013.01); *B82Y 10/00* (2013.01); *H01L 21/3105* (2013.01)

(58) Field of Classification Search
CPC ................... H01L 23/49894; H01L 29/66659; H01L 21/02052; H01L 21/0206
USPC ................................................. 438/284, 471
See application file for complete search history.

(56) References Cited

U.S. PATENT DOCUMENTS 7,105,475 B2 * 9/2006 Kim et al. ..................... 510/176

(Continued)

OTHER PUBLICATIONS

Legoues, F.K., et al., "Kinetics and mechanism of oxidation of SiGe: dry versus wet oxidation," Appl. Phys. Lett. vol. 54, No. 7, Feb. 13, 1989; 3 pages.

(Continued)

*Primary Examiner* — Minh-Loan Tran
(74) *Attorney, Agent, or Firm* — Slater & Matsil, L.L.P

(57) ABSTRACT

Methods for an oxide layer over an epitaxial layer. In an embodiment, a method includes forming an epitaxial layer of semiconductor material over a semiconductor substrate; forming an oxide layer over the epitaxial layer; applying a solution including an oxidizer to the oxide layer; and cleaning the oxide layer with a cleaning solution. In another embodiment, a densification process is applied to an oxide layer including treating with thermal energy, UV energy, or both. In an embodiment for a gate-all-around device, the cleaning process is applied to an oxide layer over an epitaxial portion of a fin. Additional methods are disclosed.

20 Claims, 15 Drawing Sheets

(51) Int. Cl.
*H01L 29/775* (2006.01)
*B82Y 10/00* (2011.01)
*H01L 21/3105* (2006.01)

(56) References Cited

U.S. PATENT DOCUMENTS

| | | |
|---|---|---|
| 8,012,839 B2 | 9/2011 | Liu et al. |
| 8,361,869 B2 | 1/2013 | Zhou et al. |
| 2013/0334610 A1 | 12/2013 | Moroz et al. |
| 2014/0042500 A1 | 2/2014 | Wann et al. |
| 2014/0183633 A1 | 7/2014 | Chen et al. |

OTHER PUBLICATIONS

Pouydebasque, A., et al., "High-Performance High-K/Metal Planar Self-Aligned Gate-All-Around CMOS Devices," IEEE Transactions on Nanotechnology, vol. 7, No. 5, Sep. 2008, pp. 551-557.

Tanaka, M., et al., "Abnormal oxidation characteristics of SiGe/Si-on-insulator structures depending on piled-up Ge fraction at SiO2/SiGe interface," J. Appl. Phys. 103, 054909 (2008); 5 pages.

Tetelin, C., et al., "Kinetics and mechanism of low temperature atomic oxygen-assisted oxidation of SiGe layers," J. Appl. Phys. vol. 83, No. 5, Mar. 1, 1998; 5 pages.

Park, S.G. et al., "Kinetics and mechanism of wet oxidation of GexSi1-x alloys," J. Appl. Phys. vol. 75, No. 3, Feb. 1, 1994, 7 pages.

\* cited by examiner

METHODS FOR WET CLEAN OF OXIDE LAYERS OVER EPITAXIAL LAYERS

This application claims the benefit of priority to U.S. Provisional Application Ser. No. 61/784,768, entitled "Methods for Wet Clean of Oxide Layers Over Epitaxial Layers," filed on Mar. 14, 2013, which application is incorporated by reference herein in its entirety.

CROSS REFERENCE TO RELATED APPLICATIONS

This application is related to co-pending U.S. patent application Ser. No. 13/730,640, entitled "Semiconductor Devices and Methods of Manufacture Thereof," filed on Dec. 28, 2012, which application is hereby incorporated by reference in its entirety.

TECHNICAL FIELD

The embodiments relate generally to the use of wet clean techniques to improve the an oxide formed overlying an epitaxial semiconductor layer, and more particularly, to improved oxide quality for oxides overlying Si/SiGe/Ge/III-V materials such as are used to form gate-all-around devices.

BACKGROUND

Recent improvements for transistors have involved the use of multiple gate devices. By using a three dimensional structure as the channel of a transistor and forming a gate overlying more than one surface of the channel region, the gate width may be increased without a corresponding increase in silicon area. Evolution of these multiple gate transistors led to the development of finFET devices which have a gate portion overlying a fin that includes a source and drain region, and a channel. In a finFET the gate forms over the two vertical sides and the horizontal top portion of the fin, increasing the gate width substantially over a similar sized planar metal-oxide-semiconductor (MOS) FET.

Further increases in performance have been achieved using a gate-all-around structure for the FET. In this approach, gate material is formed on all sides of a rectangular, elliptical or cylindrical channel region with adjacent source and drain regions. Silicon nanowires, for example, are surrounded by a gate dielectric and an overlying gate conductor on all sides. In forming a gate-all-around FET, a semiconductor portion may be subjected to oxidation to form an oxide. Defects in this oxide can lead to leakage problems, and reduced oxide performance.

BRIEF DESCRIPTION OF THE DRAWINGS

For a more complete understanding of the illustrative embodiments described herein, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

Figure 1:
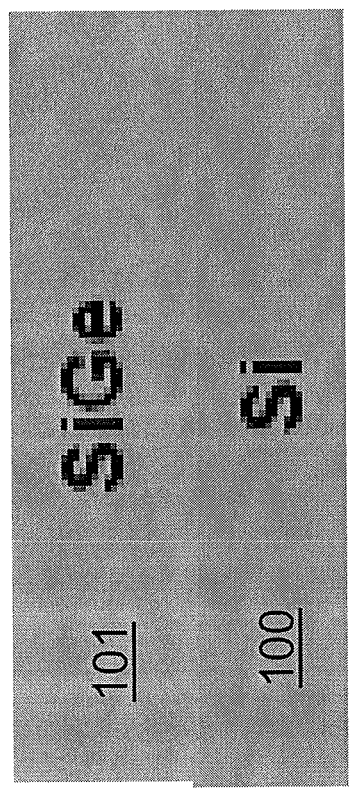
FIG. 1 illustrates, in a cross sectional view, a substrate with an epitaxial layer of semiconductor material.

The making and using of example illustrative embodiments are discussed in detail below. It should be appreciated, however, that the embodiments provide many applicable inventive concepts that can be embodied in a wide variety of specific contexts. The specific embodiments discussed are merely illustrative of specific ways to make and use the various embodiments, and do not limit the scope of the specification, or the appended claims.

The use of gate-all-around devices to provide transistors with improved performance is continuing, and further the use of germanium and silicon germanium and other III-V materials is increasing to increase integrated circuit performance over conventional silicon finFET devices. In an example illustrative process for a gate-all-around device, an epitaxial layer of silicon germanium (SiGe) may be formed over a silicon layer on a substrate. The silicon layer may be a silicon layer over an insulator (SOI) from an SOI wafer, for example. Alternatively a silicon substrate may provide a silicon layer. An oxide may be formed over the epitaxial SiGe layer. This oxide can be formed in a thermal oxidation process using a furnace. In an alternative embodiment, the oxide is formed using in situ steam generation (ISSG) process, which forms the oxide more rapidly than the furnace.

The oxide formed in this illustrative example has been observed to be SiGeOx, silicon germanium oxide. The oxide includes unreacted germanium regions. Further, the germanium can be subject to thermal diffusion and cause defects in the oxide. In the process for forming the gate-all-around FET devices, this oxide is used to isolate a source and drain region and so leakage in this oxide, such as is caused by these defects, reduces performance of the finished devices and is undesirable.

In the various embodiments, certain wet cleaning processes are provided that follow oxidation of a SiGe, Ge, or III-V material layer to form an oxide. The wet clean steps include using an oxidizer in a solution to oxidize unreacted atoms from within the oxide. It is believed that the oxidizer forms, with these unreacted atoms, soluble oxide. In an embodiment, a SiGe layer is oxidized to form a SiGeOx oxide layer. The SiGeOx layer is treated with an oxidizer. It is believed the unreacted Ge atoms, which form dense Ge regions in the oxide, then combine with the oxidizer. Further, it is believed that because Ge-Ox is soluble, it is then removed by the cleaning fluid in wet processes. The silicon oxide layer that remains is largely free from germanium, which improves the oxide isolation quality and improves the interface density (Dit).

In the various embodiments, the wet clean processes applied to the oxide include cleaning with any of $H_2SO_4$: $H_2O_2$:$H_2O$ (sulfuric acid peroxide mixture or "SPM", sometimes called "Piranha") alone, SPM followed by ammonium hydroxide peroxide mixture ($NH_4OH$:$H_2O_2$:$H_2O$, or "APM"); SPM followed by an ozone or $O_3$ clean; $O_3$ clean only; SC-1 (a standard solution of $NH_4OH$:$H_2O_2$:$H_2O$, sometimes called APM) followed by SC-2 (a standard solution of $HCl$:$H_2O_2$:$H_2O$, sometimes referred to as "HPM"), followed by SPM; SC-1 followed by SC-2 followed by $O_3$ clean; $O_3$ followed by SC-1 followed by SC-2; $O_3$ followed by SC-1 followed by SC-2 followed by another $O_3$. Any combination of the above cleans can be used to form various additional embodiments. Generally, the first treatment should include an oxidizer to oxidize the unreacted semiconductor atoms, which are defects in the oxide layer, and then cleaners can be used to dissolve and carry away the soluble oxide, leaving the silicon oxide layer containing SiOx with little remaining defects, if any. The oxidizer, in various embodiments is, any of $H_2SO_4$, $H_2O_2$, $O_3$, $HNO_3$ and combinations of these, for example.

In additional embodiments the wet cleaning process is followed by additional treatments to further densify the oxide layer. In the various embodiments, thermal, UV and combinations of thermal and UV energy are applied to improve the characteristics of the oxide layer over the semiconductor layer.

Applications of the embodiments include wet cleaning and/or wet cleaning with thermal or UV treatment of the oxide overlying a portion of a gate-all-around device. In some embodiments, applications are to treating oxide layers overlying an epitaxial layer such as SiGe. In additional embodiments, applications are to treating oxide over Ge layers. Additional applications are to improve oxide layers overlying any III-V semiconductor material.

In an embodiment, a gate-all-around device is formed. In an example embodiment a silicon portion is formed over a SiGe portion. In the SiGe example, a semiconductor fin is formed. In an embodiment, the fin is silicon. A silicon germanium or germanium portion is formed overlying the silicon fin. Another silicon portion is formed overlying the silicon germanium portion. An etching process removes dummy oxidation to expose the silicon and to expose a portion of the silicon germanium underlying the silicon.

An oxidation process is performed on both the silicon and the silicon germanium. The oxidation process can be a thermal oxidation or in an alternative embodiment, an in situ steam generated ("ISSG") oxidation process.

Following the oxidation process, in various embodiments, a wet clean process is used to remove unreacted Ge portions from the oxide layer. The Ge atoms may be unreacted Ge or Ge may diffuse into the oxide layer from the SiGe layer. An oxidizer is applied in a solution. Surprisingly, it has been discovered that applying the oxidizer and using a solution treatment removes the dense Ge from the oxide layer.

Embodiments of the wet clean process include treating the oxide with an oxidizer in solution such as $O_3$, $H_2SO_4$, $H_2O_2$, $HNO_3$, and HCl among others. The wet clean process can include sulfuric acid peroxide mixture (SPM), SPM and ammonium peroxide mixture (APM), cleaning solutions such as SC-1, SC-2, $O_3$, and hydrochloric peroxide mixture (HPM). Combinations of these may be used to remove the Ge-Ox molecules simultaneously while the oxidizer is applied, or by applying subsequent clean steps after the oxidizer is applied.

In additional embodiments, the oxide layer is treated with an additional process applying energy to reduce or eliminate voids in the oxide and to increase densification of the oxide. A combination thermal and UV treatment can be used. In various alternative embodiments, a UV treatment, or a thermal treatment, may be used.

FIG. 1 illustrates, in a simplified cross sectional view, a semiconductor substrate 100 having a silicon layer, which can be a substrate, or silicon on insulator (SOI) layer, with a second layer 101 of silicon germanium overlying it. In an embodiment, the silicon germanium or SiGe layer 101 is formed by epitaxial processes. In additional embodiments, the epitaxial layer may be Ge, and in still additional embodiments, the epitaxial layer may include a III-V material, such as GaAs, InP GaP and GaN, as non-limiting examples.

Figure 2:
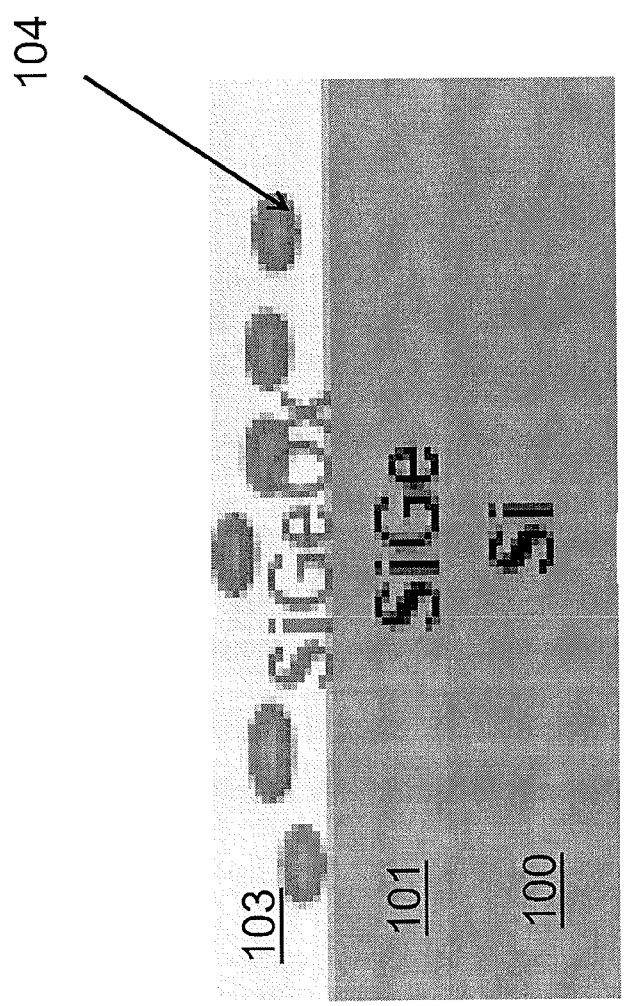
FIG. 2 illustrates, in a cross sectional view, the substrate FIG. 1 after an oxidation step.

FIG. 2 illustrates the substrate 100 following additional processing. In FIG. 2, an oxidation layer 103 is formed overlying the SiGe layer 101. In this illustrative example, this oxidation layer 103 will include silicon, germanium, and oxygen and forms an oxide of SiGeOx. In addition, dense Ge atoms that are unreacted may condense in the oxide layer 103 and form Ge regions 104. These Ge regions 104 are defects in the oxide 103, and reduce the electrical isolation that would be obtained without the defects, and if left in the SiGeOx layer, may contribute to leakage in a transistor device.

Figure 3:
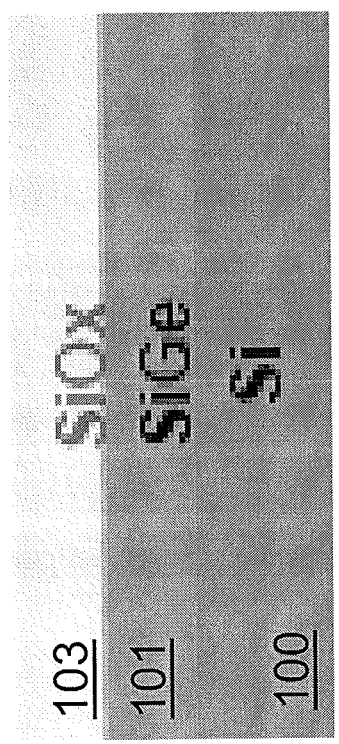
FIG. 3 illustrates, in a cross-sectional view, the substrate of FIG. 2 following the use of an embodiment wet clean process.

FIG. 3 illustrates the oxide layer after application of an embodiment, a wet clean process. The unreacted Ge portions 104 are now removed from the oxide layer 103, which is now essentially SiOx and is free from or substantially free from Ge. In the embodiments, a solution including an oxidizer is applied to the oxide layer 103. The oxide layer 103 is then cleaned using one of several different wet clean processes. After the wet clean, the oxide layer has no dense phase Ge regions, as shown in FIG. 3. Surprisingly, it has been discovered that by using certain oxidizers and wet clean solutions, the dense Ge regions, which are defects in the oxide layer 103, may be simply removed. A possible mechanism that occurs is the unreacted Ge atoms form GeOx with the oxidizer. GeOx is soluble, thus it is then apparently removed by the wet cleaning process, leaving the oxidation layer 103 without Ge regions 106.

Figure 4:
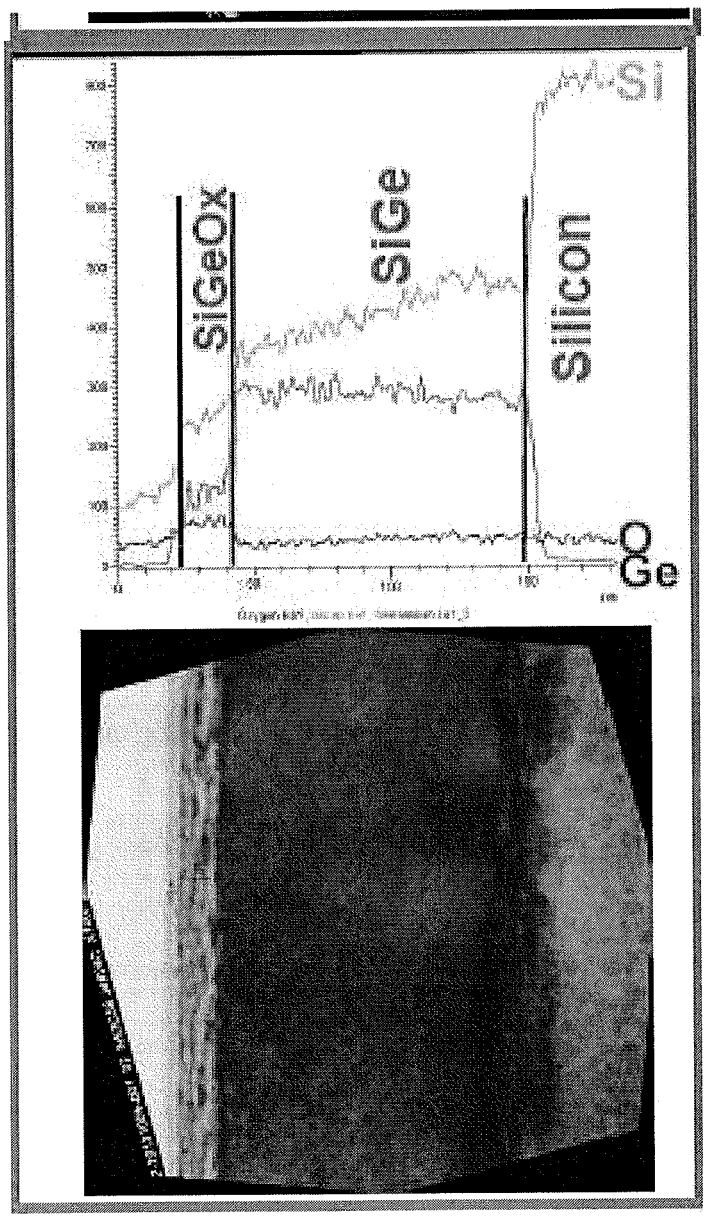
FIG. 4 depicts a SEM image for an example structure and a corresponding composition of material analysis.
Figure 5:
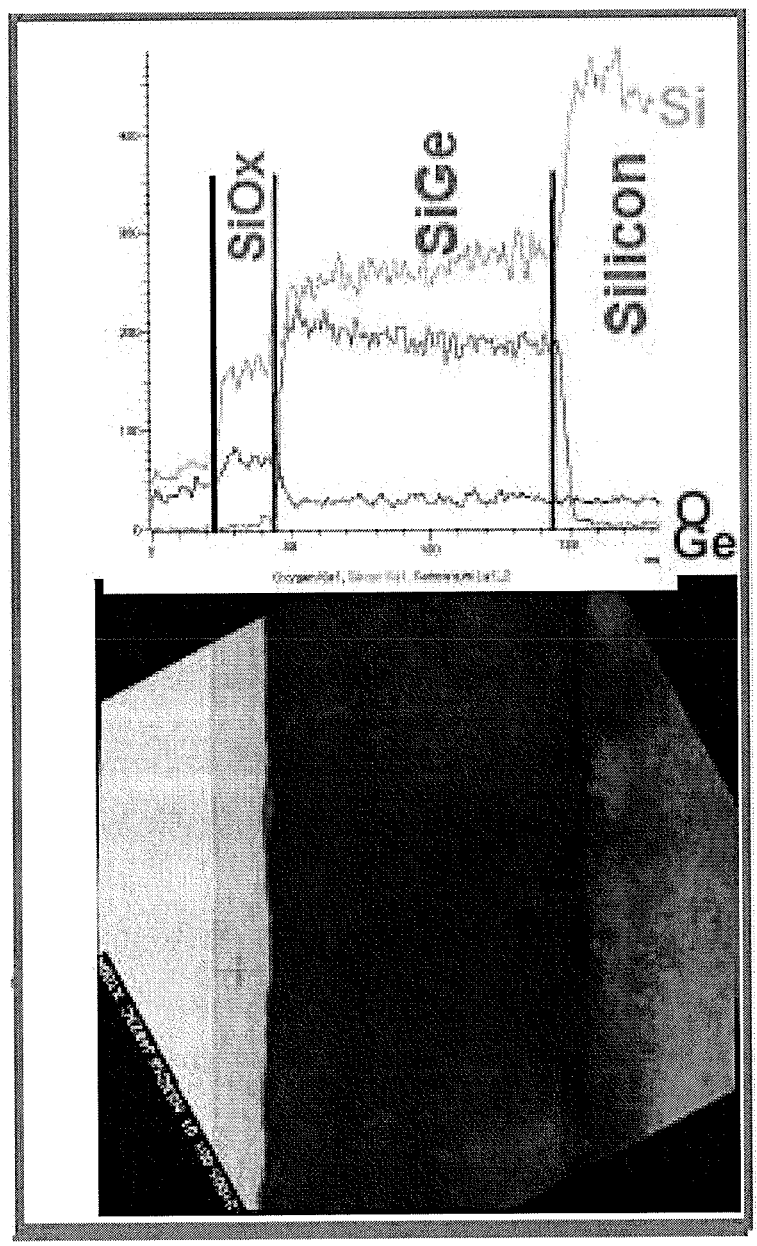
FIG. 5 depicts a SEM image for an example structure illustrating the results obtained by use of an embodiment wet clean process, and a corresponding composition of material analysis.

FIGS. 4 and 5 compare an example oxide layer before, and after, application of a wet clean process of the embodiments. In various embodiments, the wet clean can include any of the following cleaning steps, and combinations of these: $H_2SO_4$: $H_2O_2$:$H_2O$ (sulfuric peroxide mixture or "SPM", which is sometimes called "Piranha") alone, SPM followed by ammonium hydroxide peroxide mixture ($NH_4OH$:$H_2O_2$:$H_2O$, or "APM"); SPM followed by an ozone or $O_3$ clean; $O_3$ clean alone; SC-1 followed by SC-2, followed by SPM; SC-1 followed by SC-2 followed by $O_3$ clean; $O_3$ followed by SC-1 followed by SC-2; $O_3$ followed by SC-1 followed by SC-2 followed by another $O_3$; and combinations of these.

In FIG. 4 a sample of material from a conventional process is shown in a SEM image, and a composition of matter analysis is plotted alongside the SEM image showing, at different depths, the materials found. In FIG. 4, the oxide layer, labeled SiGeOx at the top of the plot, shows a substantial amount of Ge. Unreacted Ge forms defects in the oxide.

In contrast to FIG. 4, FIG. 5 shows the benefits obtained by the use of the wet clean processes of the embodiments. In FIG. 5, a sample of the oxide formed on SiGe is shown in an SEM image. This sample was cleaned using an embodiment wet clean process. As shown in the composition of matter plot alongside the SEM image, the oxide, labeled SiOx at the top of the plot of FIG. 5, is substantially free of Ge. Thus, the embodiment wet clean process has removed the dense Ge regions from the silicon oxide.

Figure 6:
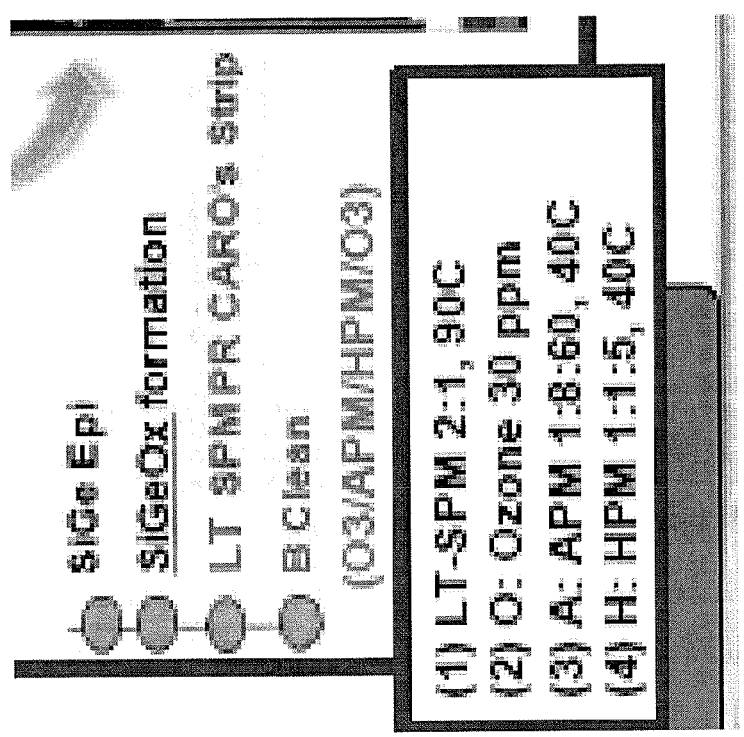
FIG. 6 depicts in a simple flow chart diagram an example method embodiment.

FIG. 6 depicts in a flow diagram from top to bottom one illustrative example method embodiment, which is used here for illustration only and is non-limiting. After the SiGe epi layer is subjected to an oxidation, which can be a thermal oxidation process, or an in situ steam generated (ISSG) oxidation process, the oxide layer is treated with a solution, which is in this non-limiting example SPM at a low temperature, or "LT-SPM". This mixture is sometimes used as a photoresist stripping solution and may also be referred to as "Caro's solution" or "Caro's PR strip."

A wet cleaning process is then applied to the oxide layer. In this particular example, this step is labeled "B Clean". In one embodiment, an ozone solution of $O_3$ in DI water is applied. Next an APM (ammonium peroxide mixture) is applied. Next an HPM (hydrochloric peroxide mixture) is applied. Finally, as shown in FIG. 6, the $O_3$ solution is again applied. Process conditions for this illustrative example are also shown in FIG. 6, for example the $O_3$ solution is 30 parts per million, the SPM is applied at 90 degrees Celsius, and the other solutions are at 40 degrees C. Note that this illustrative example describes but one embodiment and does not limit the other embodiments.

Sequential flows using the various embodiments include SPM+APM, SPM+$O_3$ cleaning, $O_3$ cleaning alone, SC-1 or APM+SC2 or HPM+SPM, SC-1+SC-2+$O_3$, $O_3$+SC-1+SC-2, $O_3$+SC-1+SC-2+$O_3$. Various embodiments include all of these sequential process flows, and combinations of these.

The conditions for use of these solutions in the embodiments vary but include, for example, SC-1, SC-2 in temperature range from 40 to 80 degrees C., SPM from 60 to 100 degrees C., $O_3$ from 20 to 40 degrees C.; process time from 30 to 200 seconds for any of the solutions, and a variety of concentrations. For example, SPM can be from 1:1 to 10:1. SC-1 can vary from 1:8:60 to 1:2:10. SC-2 can vary form 1:1:20 to 1:1:5. $O_3$ can vary from 5 to 60 PPM.

Figure 7:
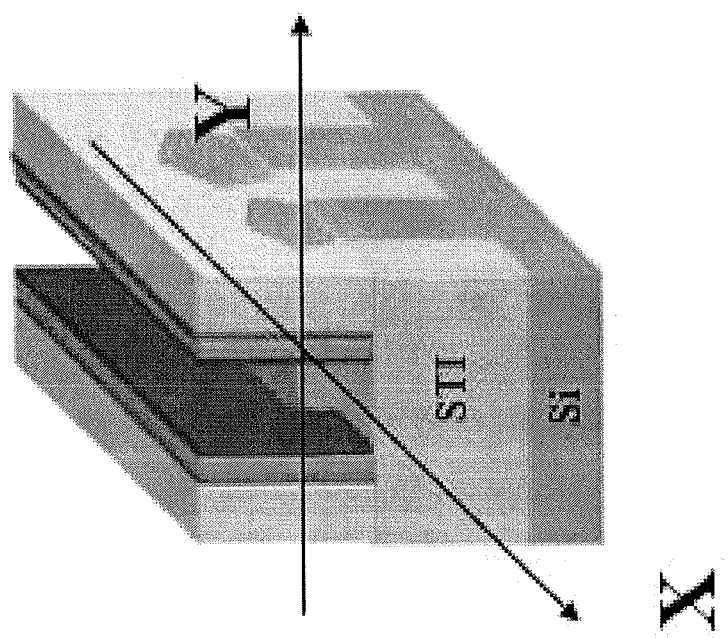
FIG. 7 illustrates in a projection a gate all around structure at an intermediate process step.

FIG. 7 depicts, in a simple three dimensional projection, a first embodiment structure 801 which is a portion of a gate all around device, such as a FET, at an intermediate process step. This three dimensional projection illustrates the X axis which is in perpendicular to the fins, and the Y axis, which is in parallel with the fins.

In order to more clearly depict the process steps used in forming an example gate-all-around device, where the embodiment wet cleaning processes can be applied, FIGS. 8-12 depict the structure 801 in cross section following various additional process steps.

Figure 8A:
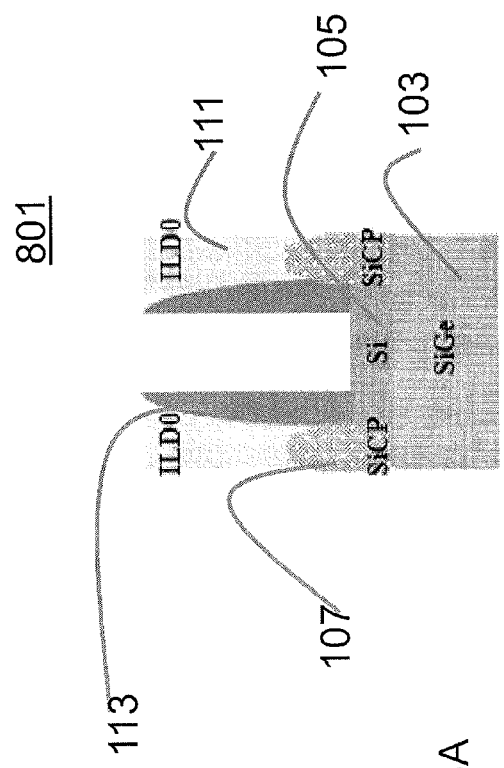
FIGS. 8A-B illustrate, in cross sectional views, the structure of FIG. 8, following additional process steps.
Figure 8B:
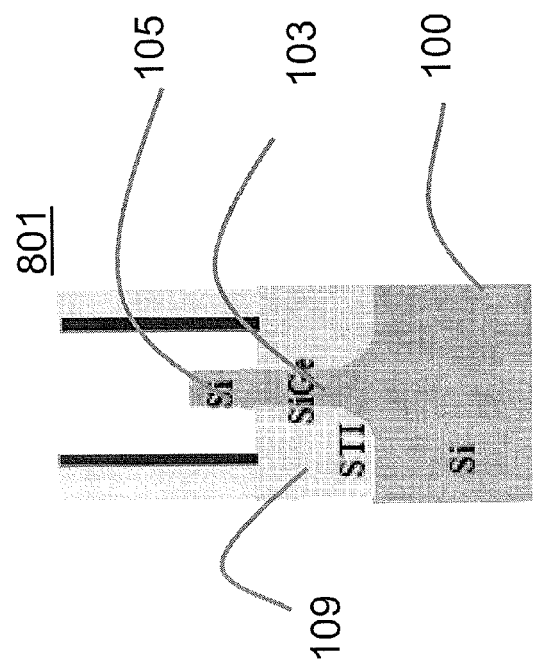

FIG. 8A depicts, in a cross section taken along the Y axis of FIG. 7, the structure 801. FIG. 8B depicts, in a cross section take along the X axis of FIG. 7, the same structure 801.

In FIGS. 8A and 8B, a polysilicon layer has been removed and a dummy oxide layer is recessed to expose the upper part of SiGe 103 underlying silicon region 105. The SiGe is over a silicon fin formed as the upper portion of substrate 100. Shallow trench isolation or STI regions 109 are shown electrically isolating this device from other similar ones on the substrate. Source/drain regions 107 are, in this N type FET example, formed from phosphorous doped SiC material (SiCP) formed at either side of the silicon region 105. Thus, silicon region 105 will form a channel for the gate-all-around FET device. Spacers 113 and ILD layers 111 are shown above and on either side of silicon 105.

Figure 9A:
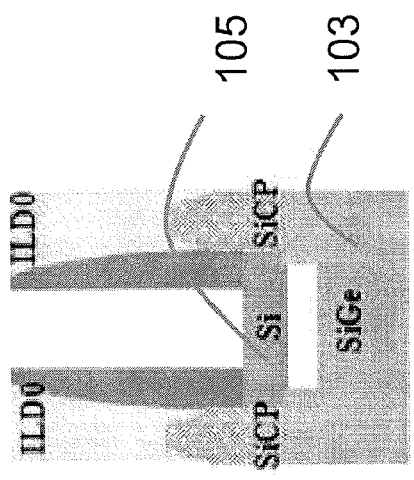
FIGS. 9A-B illustrate, in cross sectional views, the structure of FIGS. 9A-B, following additional process steps.
Figure 9B:
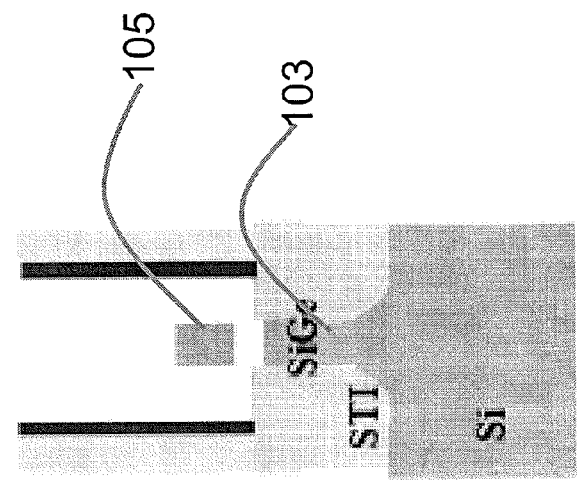

In FIGS. 9A and 9B, the structure 801 is again depicted in cross section, following additional process steps. Silicon 105 is shown after an etch is performed to reduce the SiGe 103 width. This etch is performed using a selective etch that etches SiGe at a rate that is much greater than Si. In this way the bottom of silicon portion 105 becomes available for later processing, as will be shown.

Figure 10A:
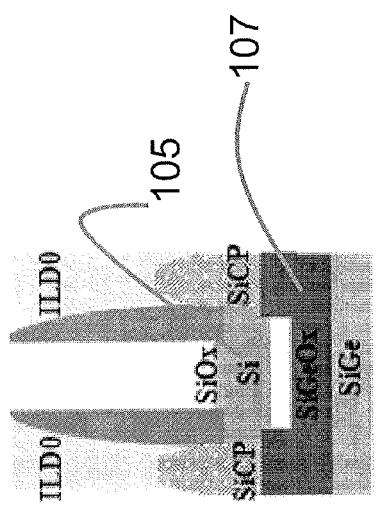
FIGS. 10A-B illustrate, in cross sectional views, the structure of FIGS. 10A-B, following additional process steps.
Figure 10B:
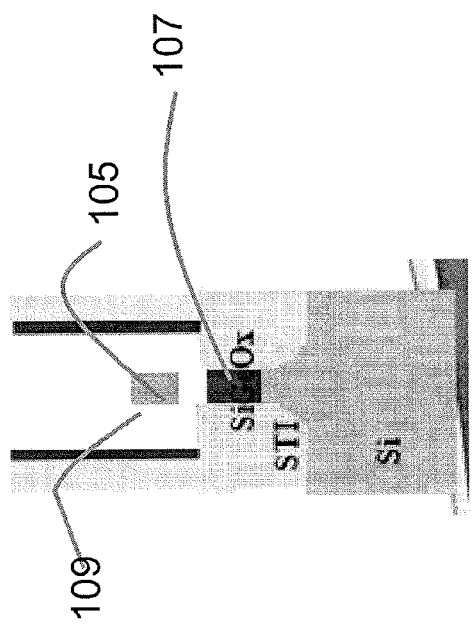

FIGS. 10A and 10B depict in another cross sectional view the structure 801, following additional processing. To transition from FIGS. 9A and 9B to 10A and 10B, thermal oxidation is applied to the structure 801. The thermal oxidation rate for the SiGe is much greater than Si, and so the thickness of the oxide of the SiGe, now numbered 107, is much thicker than that of oxide formed on the Si region 105. This characteristic allows removal of the silicon oxide from silicon portion 105 in later steps, while retaining some of the thicker oxide on the SiGe layer.

Figure 11A:
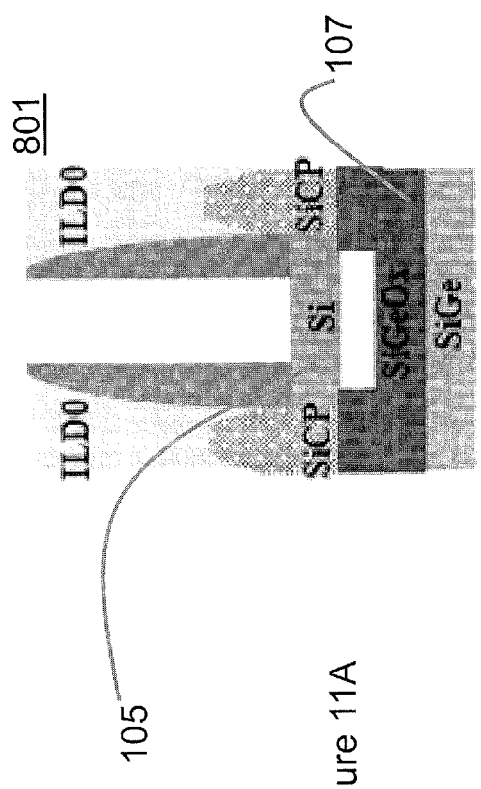
FIGS. 11A-B illustrate, in cross sectional views, the structures of FIGS. 11A-B, following additional process steps.
Figure 11B:
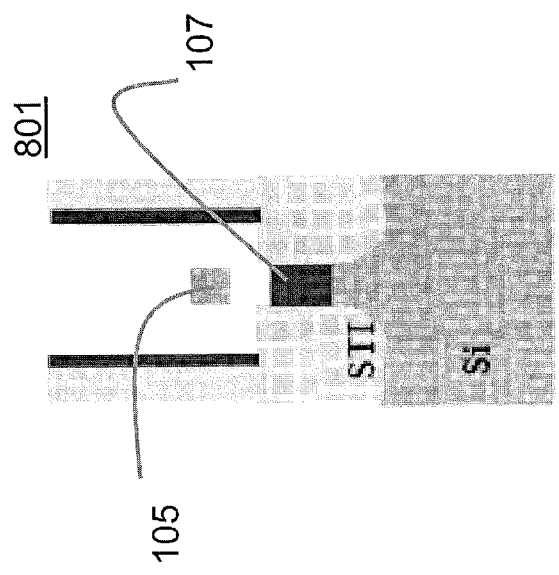

FIGS. 11A and 11B depict in another cross sectional view, the structure 801 following additional process steps. In this example process for a gate-all-around device, an etch or clean is performed to remove the SiOx from silicon portion 105 as shown. The etch rate of the oxide layer over the SiGe, layer 107, is approximately equal to the etch rate of SiOx, however, as discussed above, because the SiGeOx layer is thicker than the SiOx on portion 105, the oxide remains on the SiGe layer after the etch, and this oxide 107 provides isolation between the source and drain regions.

Figures 12A, 12B:
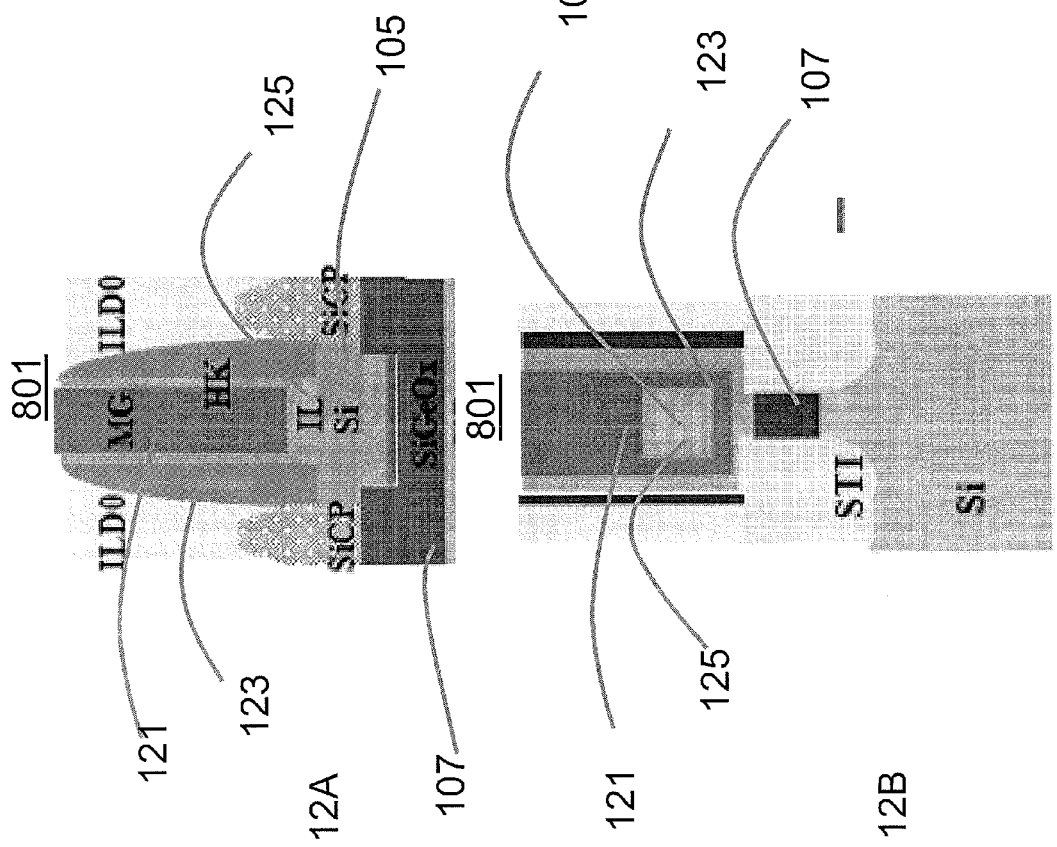
FIGS. 12A-B illustrate, in cross sectional views, the structures of FIGS. 12A-B, following additional process steps.

FIGS. 12A and 12B depict, in additional cross sectional view, structure 801 following some additional processing steps to form a gate-all-around device. Silicon portion 105 is now surrounded by an interfacial layer 125, a gate dielectric which may be, for example, a high-k dielectric 123, and a conductive gate 121, which may be, for example, a metal gate, and in a more specific example, an aluminum gate. Because the silicon portion 105 is now surrounded by the gate material 121 on all sides, this structure is called a "gate-all-around" or GAA FET structure.

Figure 13A:
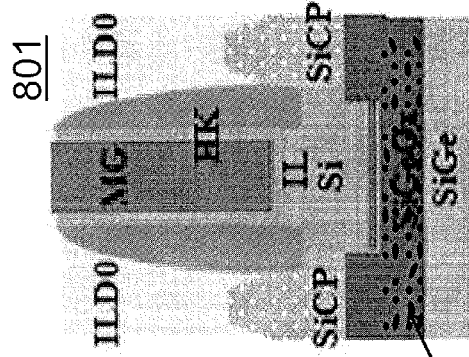
FIGS. 13A-B illustrate, using cross sectional views, the results obtained using an embodiment wet clean process embodiment on a gate-all-around structure.
Figure 13B:
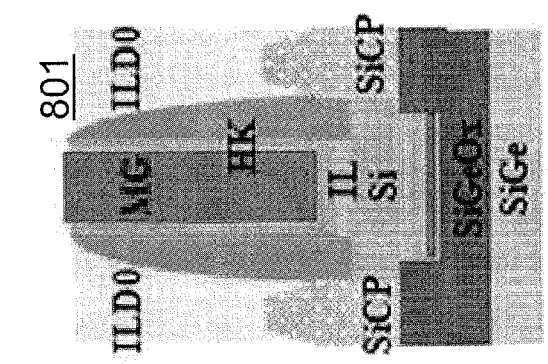

FIGS. 13A and 13B compare two cross sectional views to illustrate the advantageous use of the embodiments. In FIG. 13A, the structure 801 is shown formed using a conventional process flow, without the use of the wet cleaning process of the embodiments on the oxide layer on the SiGe epitaxial material. Defects, which are Ge regions 104, are shown in the oxide layer.

In contrast, FIG. 13B illustrates, in cross section, a structure 801 formed using a novel process flow that includes the use of the wet clean processes of the embodiments on the SiGe oxide layer. As shown in FIG. 13B, the SiGeOx oxide layer is free from Ge defect regions (104 in FIG. 13A).

While the use of the wet clean embodiments removes the unreacted Ge regions from the oxide layer as described above, improving the oxide layer over the prior approaches, it has been further discovered that the density of the oxide layer can be yet further improved by an additional process step. In these additional embodiments, energy is applied to the oxide layer following the wet clean processes described above, and the oxide that results has fewer voids and greater density. One mechanism that may explain these surprising results obtained by use of the embodiments is that the wet clean process which, as described above, removes the Ge from the oxide layer, may leave voids in the oxide where the Ge dense phase regions were located. By applying a densification process, the oxide may be further improved by removing these voids.

In the embodiments, the densification process includes applying thermal energy, UV energy, or both simultaneously. In an example, a combination of thermal and UV energy were applied to the oxide layer following the wet clean above. The process time can vary from 30 seconds to 120 minutes. The temperature can vary from 300 C-550 C, and the ultraviolet wavelength may vary from 190 to 400 nanometers. A UV/thermal annealing tool can be used for the densification process of the embodiments.

Figure 14C:
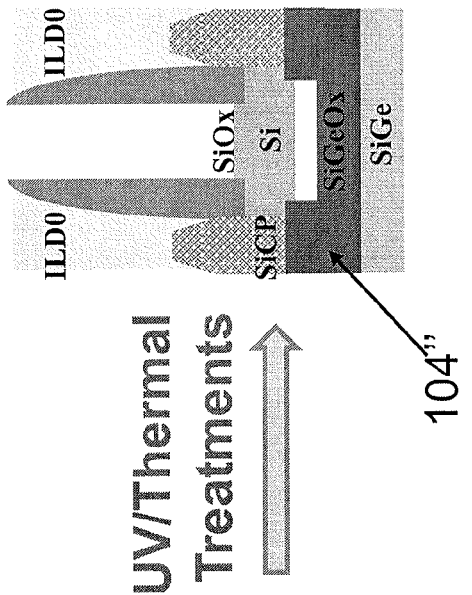
FIGS. 14A-C illustrate, using cross sectional views, the operation of the wet clean process and densification process embodiments on a gate-all-around structure.
Figure 14B:
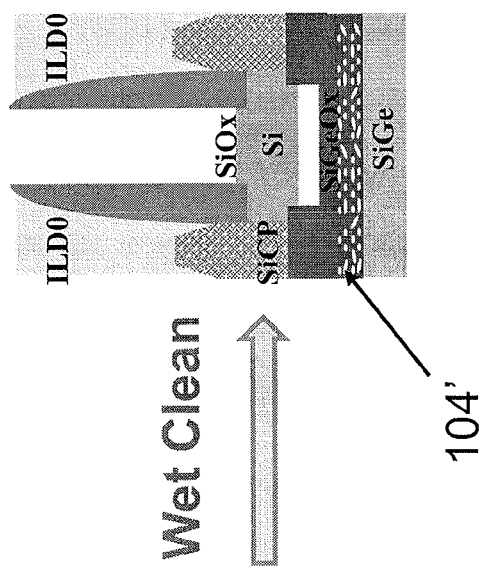
Figure 14A:
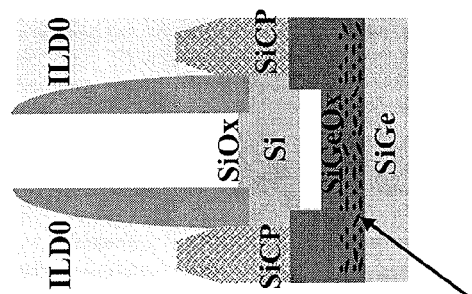

FIGS. 14A, 14B and 14C depict the results obtained by use of the embodiments in a process for forming a gate-all-around structure. In FIG. 14A a cross sectional view of a gate all around structure is shown following an oxidation step. Dense Ge regions 104 are shown in the SiGeOx oxide layer.

FIG. 14B depicts the gate all around structure in cross section after an embodiment wet clean process is performed. The oxide layer SiGeOx no longer has the Ge dense phase regions, instead, the unreacted Ge has been removed. However, voids 104' may appear in the locations where the Ge regions were removed.

FIG. 14C then depicts the gate all around structure of FIG. 14B following the use of the thermal/UV densification treatment of the embodiments. The voids are removed as shown by reference numeral 104" and the oxide is now denser, and free from either the Ge regions, or voids.

Figure 15:
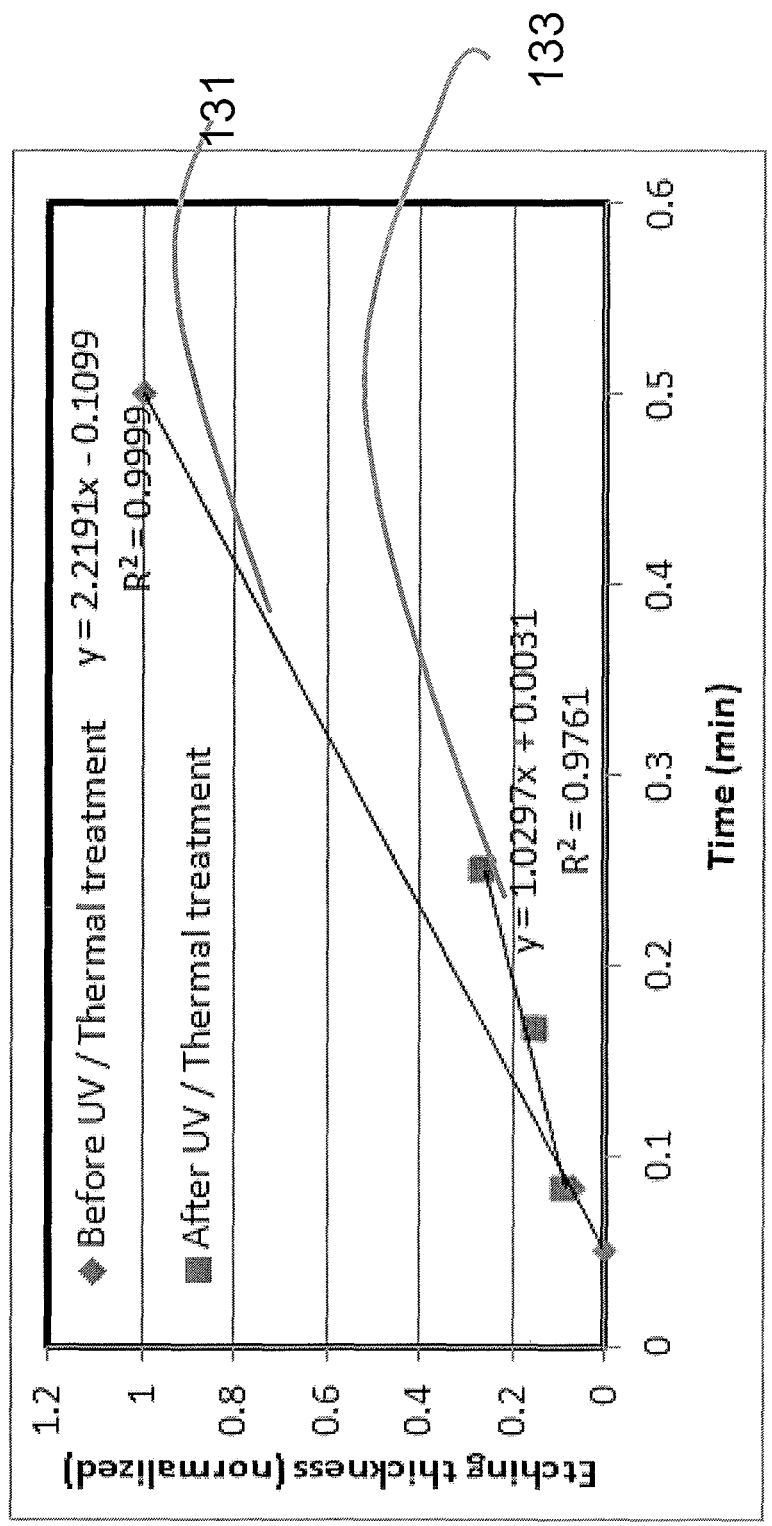
FIG. 15 illustrates, in an etching rate graph, a comparison between an oxide formed without and formed with an embodiment densification process.

FIG. 15 illustrates in a etch rate comparison plot the advantageous results obtained using the densification process of the embodiments. In FIG. 15, curve 131 illustrates the etch rate versus time of an oxide formed over a SiGe using a process flow without the UV/Thermal treatment of the embodiments. In FIG. 15, curve 133 depicts the etch rate versus time for the same material after use of the densification treatment of the embodiments.

As can be seen from FIG. 15, the material treated with the embodiments has a much lower etching rate, indicating a higher oxide density, about 50% higher in this example.

Use of the embodiments provides an oxide for a SiGe epitaxial layer free from defects, such as unreacted Ge atoms, for example, and without voids. Additional embodiments include wet clean treatment of oxides formed over a Ge layer, and wet clean of oxides formed over layers of III-V materials such as are used in gate-all-around device processes. The embodiments can include a thermal/UV densification treatment following the wet clean process.

In one embodiment, a method includes forming an epitaxial layer of semiconductor material over a semiconductor substrate; forming an oxidation layer over the epitaxial layer; applying a solution including an oxidizer to the oxidation layer; and cleaning the oxidation layer with a cleaning solution. In a further embodiment, the above method uses a solution wherein an oxidizer and the cleaning solution are the same solution. In yet another embodiment, the above methods include wherein the solution including an oxidizer includes one of $H_2SO_4$, $H_2O_2$, $O_3$, $HNO_3$, and HCl. In still another embodiment, the above methods include wherein the cleaning solution comprises one of $H_2SO_4:H_2O_2:H_2O$, $NH_4OH:H_2O_2:H_2O$, $HCL:H_2O_2:H_2O$, $O_3:H_2O$; $HF:H_2O$ and combinations thereof. In still another embodiment, the above methods include wherein the semiconductor substrate is a silicon substrate.

In further embodiments, in the above methods, the epitaxial layer is a silicon germanium layer. In still another embodiment, in the above methods, the epitaxial layer is a germanium layer. In yet another method embodiment, in the above methods, the epitaxial layer is a III-V material layer.

In yet another embodiment, a method comprises forming a silicon fin over a silicon substrate; forming a silicon germanium region over the silicon fin; forming a silicon region over the silicon germanium region; etching to expose a portion of the silicon germanium region; performing a thermal oxidation to form an silicon germanium oxide in a portion of the silicon germanium region; and treating the silicon germanium oxide with a solution including an oxidizer. In still another embodiment, the above method includes subsequently cleaning the silicon germanium oxide layer with another solution.

In yet another embodiment, the above methods are performed and after treating the silicon germanium oxide with a solution, performing a densification process on the silicon germanium oxide by applying one of thermal energy, UV energy, or a combination of thermal and UV energy to the silicon germanium oxide. In yet a further embodiment, in the above methods, the methods include etching the silicon region to remove silicon oxide from the silicon region; forming an interfacial layer on the exterior of the silicon region; forming a gate dielectric layer on the interfacial layer; and forming a metal gate on the gate dielectric layer; wherein the metal gate and the gate dielectric are formed all around the silicon region.

In yet another embodiment, a method includes forming an epitaxial layer over a silicon substrate; performing an oxidation of the epitaxial layer to form an oxide layer containing unreacted atoms; treating the oxide with a solution including an oxidizer to form soluble oxide molecules with the unreacted atoms; and wet cleaning the oxide with a solution to remove the soluble oxide molecules. In still another embodiment, a method includes wherein the epitaxial layer comprises germanium. In yet a further embodiment, a method includes wherein the epitaxial layer comprises silicon germanium. In still another embodiment, the above methods include wherein the oxide layer comprises silicon germanium oxide. In a further embodiment, in the above methods, the unreacted atoms comprise germanium atoms. In still another embodiment, in the above methods, the solution including an oxidizer includes an oxidizer that is one taken from the group consisting essentially of $H_2SO_4$, $H_2O_2$, $O_3$, $HNO_3$, and HCl. In yet another embodiment, in the above methods, the solution used in the wet cleaning includes one taken from $H_2SO_4$: $H_2O_2:H_2O$, $NH_4OH:H_2O_2:H_2O$, $HCL:H_2O_2:H_2O$, $O_3:H_2O$; $HF:H_2O$ and combinations thereof.

In another method embodiment, the method includes forming a silicon fin over a silicon substrate; forming a silicon germanium region over the silicon fin; forming a silicon region over the silicon germanium region; etching to expose a portion of the silicon germanium region; performing a thermal oxidation to form an silicon germanium oxide in a portion of the silicon germanium region; and treating the silicon germanium oxide with a solution including an oxidizer.

In yet another embodiment, the above methods include subsequently cleaning the silicon germanium oxide layer with another solution. In still another embodiment, the above methods include after treating the silicon germanium oxide with a solution: performing a densification process on the silicon germanium oxide by applying one of thermal; energy, UV energy, or a combination of thermal and UV energy to the silicon germanium oxide.

In still another embodiment, the above methods include etching the silicon region to remove silicon oxide from the silicon region; forming an interfacial layer on the exterior of the silicon region; forming a gate dielectric layer on the interfacial layer; forming a metal gate on the gate dielectric layer; wherein the metal gate and the gate dielectric are formed all around the silicon region.

In yet another embodiment, a method includes forming an epitaxial layer over a silicon substrate; performing an oxidation of the epitaxial layer to form an oxide layer containing unreacted atoms; treating the oxide with a solution including an oxidizer to form soluble oxide molecules with the unreacted atoms; and wet cleaning the oxide with a solution to remove the soluble oxide molecules.

In yet another embodiment, the above methods include wherein the epitaxial layer comprises germanium. In still a further embodiment, in the above methods, the epitaxial layer comprises silicon germanium. In another embodiment, in the above methods, the oxide layer comprises silicon germanium oxide. In still a further embodiment, in the above methods, the unreacted atoms comprise germanium atoms. In yet another embodiment, in the above methods, the treatment with solution containing an oxidizer and the wet cleaning with a solution are performed simultaneously with a solution including $HSO_4$.

Although the example embodiments have been described in detail, it should be understood that various changes, substitutions and alterations can be made herein without departing from the spirit and scope of the application as defined by the appended claims. For example, different materials may be utilized for the conductors, the guard rings, the solder balls, the build up layers or different methods of formation may be utilized for the various layers of material. These devices, steps and materials may be varied while remaining within the scope of the appended claims.

Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods or steps, presently existing or later to be developed, that perform substantially the same function or achieve substantially the same result as the corresponding embodiments described herein may be utilized according to the embodiments and alternative embodiments. Accordingly, the appended claims are intended to include within their scope such processes, machines, manufacture, compositions of matter, means, methods, or steps.

What is claimed is:

1. A method, comprising:
    forming an epitaxial layer of semiconductor material over a semiconductor substrate;
    forming an oxide layer over the epitaxial layer;
    applying a solution including an oxidizer to the oxide layer; and
    cleaning the oxide layer with a cleaning solution.

2. The method of claim 1, wherein the solution including an oxidizer and the cleaning solution are the same solution.

3. The method of claim 1, wherein the solution including an oxidizer includes one taken from the group consisting essentially of $H_2SO_4$, $H_2O_2$, $O_3$, $HNO_3$, and HCl.

4. The method of claim 1, wherein the cleaning solution comprises one taken from the group consisting essentially of $H_2SO_4:H_2O_2:H_2O$, $NH_4OH:H_2O_2:H_2O$, $HCL:H_2O_2:H_2O$, $O_3:H_2O$, and $HF:H_2O$, and combinations thereof.

5. The method of claim 1, wherein the semiconductor substrate is a silicon substrate.

6. The method of claim 1, wherein the epitaxial layer is a silicon germanium layer.

7. The method of claim 1, wherein the epitaxial layer is a germanium layer.

8. The method of claim 1, wherein the epitaxial layer is a III-V material layer.

9. A method, comprising:
    forming a silicon fin over a silicon substrate;
    forming a silicon germanium region over the silicon fin;
    forming a silicon region over the silicon germanium region;
    etching to expose a portion of the silicon germanium region;
    performing oxidation to form an silicon germanium oxide layer in a portion of the silicon germanium region; and
    treating the silicon germanium oxide layer with a solution including an oxidizer.

10. The method of claim 9 and further comprising subsequently cleaning the silicon germanium oxide layer with another solution.

11. The method of claim 9, and further comprising, after treating the silicon germanium oxide layer with a solution:
    performing a densification process on the silicon germanium oxide layer by applying one of thermal energy, UV energy, or a combination of thermal and UV energy to the silicon germanium oxide layer.

12. The method of claim 9, and further comprising:
    etching the silicon region to remove silicon oxide from the silicon region;
    forming an interfacial layer on an exterior surface of the silicon region;
    forming a gate dielectric layer on the interfacial layer; and
    forming a conductive gate on the gate dielectric layer;
    wherein the conductive gate and the gate dielectric are formed all around the silicon region.

13. A method, comprising:
    forming an epitaxial layer over a silicon substrate;
    performing an oxidation of the epitaxial layer to form an oxide layer containing unreacted atoms from the epitaxial layer;
    treating the oxide with a solution including an oxidizer to form soluble oxide molecules with the unreacted atoms; and
    wet cleaning the oxide with a solution to remove the soluble oxide molecules.

14. The method of claim 13, wherein the epitaxial layer comprises germanium.

15. The method of claim 14, wherein the epitaxial layer comprises silicon germanium.

16. The method of claim 15, wherein the oxide layer comprises silicon germanium oxide.

17. The method of claim 14, wherein the unreacted atoms comprise germanium atoms.

18. The method of claim 13, wherein the solution including an oxidizer includes an oxidizer that is one taken from the group consisting essentially of $H_2SO_4$, $H_2O_2$, $O_3$, $HNO_3$, and HCl.

19. The method of claim 13 wherein the solution used in the wet cleaning includes one taken from the group consisting essentially of $H_2SO_4:H_2O_2:H_2O$, $NH_4OH:H_2O_2:H_2O$, $HCL:H_2O_2:H_2O$, $O_3:H_2O$; $HF:H_2O$, SC-1, SC-2, APM, SPM, HPM, and combinations thereof.

20. The method of claim 13 wherein treating the oxide with a solution including an oxidizer and wet cleaning with a solution are performed simultaneously with a solution including $H_2SO_4$.

* * * * *